United States Patent
Jia et al.

(10) Patent No.: US 12,301,258 B2
(45) Date of Patent: *May 13, 2025

(54) SYSTEM AND METHOD FOR HYBRID-ARQ

(71) Applicants: Ming Jia, Ottawa (CA); Jianglei Ma, Ottawa (CA)

(72) Inventors: Ming Jia, Ottawa (CA); Jianglei Ma, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,699

(22) Filed: Jan. 15, 2024

(65) Prior Publication Data
US 2024/0267059 A1 Aug. 8, 2024

Related U.S. Application Data

(63) Continuation of application No. 17/868,058, filed on Jul. 19, 2022, now Pat. No. 11,876,536, which is a
(Continued)

(51) Int. Cl.
*H03M 13/00* (2006.01)
*H03M 13/11* (2006.01)
(Continued)

(52) U.S. Cl.
CPC .... *H03M 13/2942* (2013.01); *H03M 13/1111* (2013.01); *H04L 1/0061* (2013.01); *H04L 1/1819* (2013.01); *H04L 5/0055* (2013.01)

(58) Field of Classification Search
None
See application file for complete search history.

(56) References Cited

U.S. PATENT DOCUMENTS

2011/0041044 A1* 2/2011 Murakami .......... H03M 13/116
714/794
2017/0311294 A1 10/2017 Kim
(Continued)

FOREIGN PATENT DOCUMENTS

| CN | 102136887 A | 7/2011 |
| CN | 107005252 A | 8/2017 |

(Continued)

OTHER PUBLICATIONS

"Physical layer procedures for control", 3GPP TS 38.213 version 15.5.0 Release 15, ETSI TS 138 213 V15.5.0 (May 2019).
(Continued)

*Primary Examiner* — Mujtaba M Chaudry

(57) ABSTRACT

Systems and methods are disclosed for providing H-ARQ transmissions in respect of a set of horizontal code blocks are combined in a code. Retransmissions contain vertical parity check blocks which are determined from verticals from the set of horizontal code blocks. Once all the vertical parity check blocks have been transmitted, a new set may be determined after performing interleaving upon either the content of the horizontal code blocks, in the case of non-systematic horizontal code blocks, or over the content of encoder input bits in the place of systematic horizontal code blocks. The interleaving may be bitwise or bit subset-wise. The retransmissions do not contain any of the original bits. In the decoder, soft decisions are produced, and nothing needs to be discarded; decoding will typically improve with each retransmission.

20 Claims, 11 Drawing Sheets

Related U.S. Application Data continuation of application No. 16/665,121, filed on Oct. 28, 2019, now Pat. No. 11,405,057.

(51) Int. Cl.
  *H03M 13/29* (2006.01)
  *H04L 1/00* (2006.01)
  *H04L 1/1812* (2023.01)
  *H04L 5/00* (2006.01)

(56) References Cited

U.S. PATENT DOCUMENTS

| | | |
|---|---|---|
| 2018/0054800 A1* | 2/2018 | Yeo .................. H04L 5/0094 |
| 2018/0159660 A1 | 6/2018 | Jia et al. |
| 2018/0262303 A1 | 9/2018 | Jia |
| 2018/0269899 A1 | 9/2018 | Noh et al. |
| 2019/0165882 A1* | 5/2019 | You .................. H04W 72/0446 |
| 2019/0165894 A1* | 5/2019 | Choi .................. H04L 5/0044 |
| 2019/0190654 A1* | 6/2019 | You .................. H04L 1/0063 |
| 2019/0215105 A1 | 7/2019 | Xu et al. |
| 2019/0319749 A1 | 10/2019 | Cao et al. |
| 2019/0356430 A1* | 11/2019 | Cheng .................. H04L 1/1896 |
| 2020/0252162 A1* | 8/2020 | Denboer .............. H04L 69/324 |

FOREIGN PATENT DOCUMENTS

| | | |
|---|---|---|
| CN | 107294652 A | 10/2017 |
| CN | 110140311 A | 8/2019 |
| JP | 2005323171 A | 11/2005 |
| WO | 2007057885 A2 | 5/2007 |
| WO | 2018099358 A1 | 6/2018 |

OTHER PUBLICATIONS

ZTE, ZTE Microelectronics, "Consideration on Outer Codes for NR", R1-1608976, 3GPP TSG-RAN WG1 #86bis, Lisbon, Portugal, Oct. 10-14, 2016.

Qualcomm Incorporated "Erasure Coding and HARQ Design", R1-1610143,3GPP TSG-RAN WG1 #86bis, Lisbon, Portugal, Oct. 10-14, 2016.

Shu Lin and Daniel J. Costello, Jr., Error Control Coding: Fundamentals and Applications, Prentice-Hall, 1983.

Joachim Hagenauer, et al., "Iterative Decoding of Binary Block and Convolutional Codes", IEEE Trans. Inf. Theory, vol. 42, No. 2, pp. 429-445, Mar. 1996.

Qualcomm Incorporated; "Outer Code Design for URLLC and eMBB Multiplexing"; 3GPP TSG-RAN WG1 #88, R1-1702641; Feb. 13-17, 2017; Athens, Greece; 10 pages.

* cited by examiner

FIG. 4A

| | 400 | | | 402 |
|---|---|---|---|---|
| $IB_1$ | $IB_2$ | $IB_3$ | $IB_4$ | Horizontal Check Block |
| $IB_5$ | $IB_6$ | $IB_7$ | $IB_8$ | Horizontal Check Block |
| $IB_9$ | $IB_{10}$ | $IB_{11}$ | $IB_{12}$ | Horizontal Check Block |
| $IB_{13}$ | $IB_{14}$ | $IB_{15}$ | $IB_{16}$ | Horizontal Check Block |
| Vertical Check Block | Vertical Check Block | Vertical Check Block | Vertical Check Block | }  1st Set of K Vertical Check Blocks 404 |

FIG. 4B

| | 400 | | | 402 |
|---|---|---|---|---|
| $IB_1$ | $IB_2$ | $IB_3$ | $IB_4$ | Horizontal Check Block |
| $IB_6$ | $IB_7$ | $IB_8$ | $IB_5$ | Horizontal Check Block |
| $IB_{11}$ | $IB_{12}$ | $IB_9$ | $IB_{10}$ | Horizontal Check Block |
| $IB_{16}$ | $IB_{13}$ | $IB_{14}$ | $IB_{15}$ | Horizontal Check Block |
| Vertical Check Block | Vertical Check Block | Vertical Check Block | Vertical Check Block | }  2nd Set of K Vertical Check Blocks 406 |

FIG. 8A

| | 800 | | |
|---|---|---|---|
| $BS_1$ | $BS_2$ | $BS_3$ | $BS_4$ |
| $BS_5$ | $BS_6$ | $BS_7$ | $BS_8$ |
| $BS_9$ | $BS_{10}$ | $BS_{11}$ | $BS_{12}$ |
| $BS_{13}$ | $BS_{14}$ | $BS_{15}$ | $BS_{16}$ |
| Vertical Check Block | Vertical Check Block | Vertical Check Block | Vertical Check Block |

1st Set of K Vertical Check Blocks 404

FIG. 8B

| | 800 | | |
|---|---|---|---|
| $BS_1$ | $BS_2$ | $BS_3$ | $BS_4$ |
| $BS_6$ | $BS_7$ | $BS_8$ | $BS_5$ |
| $BS_{11}$ | $BS_{12}$ | $BS_9$ | $BS_{10}$ |
| $BS_{16}$ | $BS_{13}$ | $BS_{14}$ | $BS_{15}$ |
| Vertical Check Block | Vertical Check Block | Vertical Check Block | Vertical Check Block |

2nd Set of K Vertical Check Blocks 806

SYSTEM AND METHOD FOR HYBRID-ARQ

CROSS REFERENCE TO RELATED APPLICATION(S)

This application is a continuation of U.S. patent application Ser. No. 17/868,058, titled "System and Method for Hybrid-ARQ" filed on Jul. 19, 2022, which is a continuation of U.S. patent application Ser. No. 16/665,121, titled "System and Method for Hybrid-ARQ" filed on Oct. 28, 2019, the entire contents of which are hereby incorporated herein by reference.

FIELD

The present application relates generally to wireless communication and in particular embodiments, to hybrid automatic repeat request (H-ARQ or HARQ) in telecommunications systems.

BACKGROUND

Hybrid automatic repeat request (H-ARQ or HARQ) is a common feature of wireless physical-layer retransmission. The original concept was called incremental redundancy (IR) based retransmission, which transmits additional bits of an untransmitted mother-code when an original transmission fails. In other words, a mother-code is stored in a circular buffer, and after an initial code block containing bits from the mother-code is transmitted, as part of the HARQ process, the transmitter transmits new IR bits from the circular buffer. The new IR bits together with the previously transmitted data form a new code block. This is repeated until a maximum number of retransmissions is reached or a code block is successfully decoded. In Long Term Evolution (LTE) Release-8, the mother code is a rate 1/3 Turbo code.

In LTE mobile broadband (MBB) transmission, a transport block is often divided into multiple code blocks (CBs) for transmission. Each code block has its own cyclic redundancy check (CRC), and the combined transport block also has an overall CRC. In LTE Release-8, when one or more than one code block is in error, a retransmission request is sent back to the transmitter. Since the transmitter does not know which code block is in error, it transmits IR bits for all the code blocks in the transport block until the maximum number of retransmissions is reached or the transport block is successfully received.

When not all code blocks are in error, retransmitting IR bits for all code blocks will obviously result in efficiency loss, because retransmitting IR bits to the code blocks that have been correctly decoded will not provide any help for the code blocks in error. In another approach, code blocks are grouped into code block groups (CBGs), and feedback is transmitted on a per-CBG basis by transmitting the index of a CBG containing a CB in error, and the entire CBG is retransmitted in response to the feedback. A disadvantage of a CBG based approach is that index feedback can be inefficient. For example, in the case when each CBG has one CB in error, the receiver still needs to feed back the indices of all the CBGs, and all CBs are retransmitted such that no retransmission is saved.

In another approach, an outer code is used. Outer codes are essentially erasure codes. The main benefit of outer codes is that there is no need to know which CBs have failed transmission. Outer codes are more effective when the number of failed CBs is small. Examples include parity-check and Reed-Solomon codes.

SUMMARY

Systems and methods are disclosed for providing H-ARQ transmissions in respect of a set of horizontal code blocks. Retransmissions contain vertical check blocks which are determined from columns of the data from the set of horizontal code blocks. Each vertical check block is based on bits from all of the horizontal code blocks. In the decoder, soft decisions are produced based on the horizontal code blocks. In a situation where one or more of the horizontal code blocks fails to be properly decoded initially, each vertical check block can be used to improve log likelihood ratios (soft decisions) for bits of the horizontal code blocks, and then horizontal decoding is performed again.

Advantageously, the transmitter does not need to know which horizontal code block(s) are in error, and this simplified feedback.

The horizontal code blocks may be systematic code blocks, in which case the vertical check blocks are determined based on the systematic bits of the systematic code blocks. Alternatively, the horizontal code blocks may be non-systematic code blocks, in which case the vertical check blocks are determined based on the all of the bits of the non-systematic code blocks.

In some embodiments, once all the vertical check blocks have been transmitted, a new set of vertical check blocks may be determined after performing interleaving upon either the content of the horizontal code blocks, in the case of non-systematic horizontal code blocks, or over the content of encoder input bits in the case of systematic horizontal code blocks. This reduces the likelihood of transmitting a vertical check block that is based on a set of bits all of which are correctly known to the receiver. The interleaving may be bitwise or bit subset-wise. In some embodiments, the retransmissions do not contain any of the original bits. In the decoder, soft decisions are produced, and nothing needs to be discarded; decoding will typically improve with each retransmission.

According to one aspect of the present disclosure, there is provided method of transmitting code blocks in an embodiment. In the method, an apparatus, such as a transmitter, generates a plurality of first code blocks, and transmits the plurality of first code blocks. The apparatus further generates at least one first check block of a first parity block, the first parity block comprises a plurality of first check blocks, each first check block determined from a respective set of bits that includes at least one bit from each of the plurality of first code blocks. Then, the apparatus transmits a retransmission containing the at least one first check block.

According to another aspect of the present disclosure, in an embodiment, there is provided an apparatus comprising: a non-transitory memory comprising instructions; and one or more processors in communications with the non-transitory memory, wherein the one or more processors are configured to execute the instructions to perform operations, the operations comprising: generating a plurality of first code blocks; transmitting the plurality of first code blocks; generating at least one first check block of a first parity block, the first parity block comprising a plurality of first check blocks, each first check block determined from a respective set of bits that includes at least one bit from each of the plurality of first code blocks; and transmitting a retransmission containing the at least one first check block.

According to another aspect of the present disclosure, there is provided a computer readable medium having computer executable instructions stored thereon that when executed by a processer perform a method of any of the disclosed embodiments or aspects.

According to another aspect of the present disclosure, in an embodiment, there is provided an apparatus comprising units or means for generating a plurality of first code blocks; transmitting the plurality of first code blocks; generating at least one first check block of a first parity block, the first parity block comprising a plurality of first check blocks, each first check block determined from a respective set of bits that includes at least one bit from each of the plurality of first code blocks; and transmitting a retransmission containing the at least one first check block.

According to another aspect of the present disclosure, a chipset system is provided in an embodiment. The chipset system includes at least one processor, used to implement the method of any of the disclosed embodiments or aspects. The chipset system may further include a memory for storing program instructions and data. The chipset system may be comprised by chipsets, and may also be comprised by at least one of chipsets and other discrete device.

Optionally, the first code blocks may comprise the horizontal code blocks, the first parity blocks may comprise the vertical parity blocks, and the first check blocks may comprise the horizontal check blocks.

Optionally, the apparatus transmits the retransmission is in response to receiving a negative acknowledgement. Alternatively, the apparatus may transmit the retransmission is in response to a timer expiring. Or the apparatus transmit the retransmission is performed without waiting for a negative acknowledgement or for a timer to expire.

Optionally, the apparatus may further generate the plurality of first code blocks comprises generating a plurality of systematic code blocks, each systematic code block comprising a respective set of systematic bits and a respective set of parity bits determined from the respective set of systematic bits.

Optionally, for each first check block, a number of systematic bits used to determine the first check block is approximately equal to a number of systematic bits in each first code block.

Optionally, generating the plurality of first code blocks comprises generating a plurality of non-systematic code blocks.

Optionally, for each first check block, a number of bits used to determine each first check block is approximately equal to a number of bits in each first code block.

Optionally, the transmitting the retransmission containing the at least one first check block is in response to a negative acknowledgement. In response to one or more further negative acknowledgements, the apparatus may transmit at least one further first check block of the first parity block.

Optionally, transmitting at least one first check block comprises transmitting all of the plurality of first check blocks.

Optionally, the transmitting the retransmission containing the at least one first check block is in response to a negative acknowledgement. In response to a further negative acknowledgement, the apparatus transmits a further retransmission containing at least one second check block of a second parity block, the second parity block comprising a plurality of second check blocks, each second check block determined over a respective set of bits that includes at least one bit from each of the plurality of first code blocks. The respective sets of bits for use in determining the first check blocks of the first parity block are organized differently than the respective sets of bits for use in determining the second check blocks of the second parity block.

Optionally, generating the plurality of first code blocks and transmitting the plurality of first code blocks comprises generating and transmitting a transport block; transmitting the retransmission is in response to receiving a negative acknowledgement; the negative acknowledgement in respect of the plurality of code blocks is a negative acknowledgement in respect of the transport block.

Optionally, for the first parity check block, each respective set of at least one bit includes correspondingly positioned bits in each of the plurality of first code blocks.

Optionally, for the second parity check block, the apparatus may reorder the bits of each first code block; wherein each respective set of at least one bit for use in determining the second check blocks of the second parity block includes bits from each of the plurality of first code blocks after bit reordering.

Optionally, for each first code block, the apparatus divides bits of the first code block into a plurality of sub-blocks, wherein each first check block is determined from a set of bits that includes one sub-block from each first code block. For the second parity block: the apparatus further reorders the sub-blocks of the each code block, and determines the check blocks of the second parity check block using the reordered sub-blocks.

Optionally, each of the plurality of first code blocks is part of a transport block for a single receiver.

Optionally, the plurality of first code blocks includes code blocks from multiple transport blocks for a single receiver.

Optionally, the plurality of first code blocks includes code blocks from multiple transport blocks for receivers.

Optionally, a number of parity bits transmitted in each retransmission is in accordance with a configurable schedule.

BRIEF DESCRIPTION OF DRAWINGS

Embodiments of the disclosure will now be described with reference to the attached drawings in which:

FIGS. 4A, 4B and 4C depict an example of a code-based approach to HARQ, where different information bit interleaving is performed to generate multiple sets of vertical check blocks, provided by an embodiment of the disclosure;

FIGS. 8A, 8B and 8C depict an example of a code-based approach to HARQ, where different information bit interleaving is performed to generate multiple sets of vertical check blocks, provided by an embodiment of the disclosure;

DETAILED DESCRIPTION

The operation of the current example embodiments and the structure thereof are discussed in detail below. It should be appreciated, however, that the present disclosure provides many applicable inventive concepts that can be embodied in any of a wide variety of specific contexts. The specific embodiments discussed are merely illustrative of specific structures of the disclosure and ways to operate the disclosure, and do not limit the scope of the present disclosure.

Figure 1:
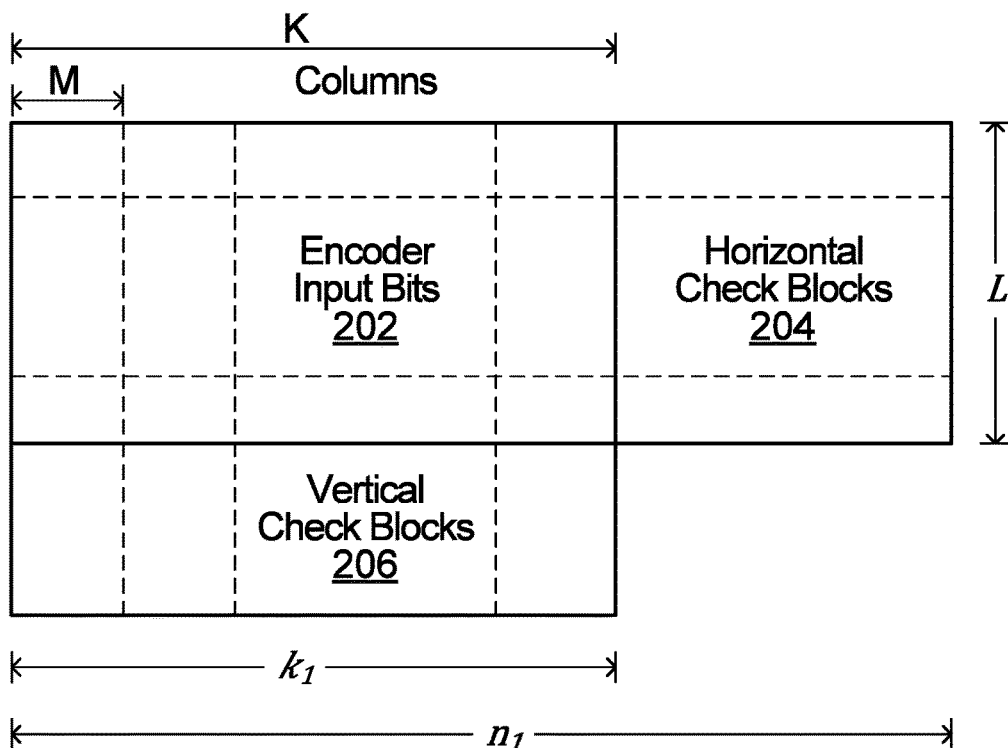
FIG. 1 depicts an example of a code-based approach to H-ARQ provided by an embodiment of the disclosure, where horizontal code blocks are systematic code blocks.

FIG. 1 illustrates a structure of a code for use in an IR transmission scheme provided by an embodiment of the disclosure. The overall code is based on encoder input bits (IBs) 202 that are logically arranged in L rows and K columns, horizontal check blocks 204, and vertical check block 206s, where L≥2 and K≥2. Each row in the code contains $n_1$ bits, that include $k_1$ encoder input bits 202 and a horizontal check block 204 containing $n_1-k_1$ parity bits. Each row of encoder input bits 202 and the corresponding horizontal check block 204 may be viewed as an $n_1$ bit horizontal CB, such that the encoder input bits 202 and the horizontal check block 204 together constitute a plurality of horizontal CBs. For this embodiment, the horizontal CBs are systematic code blocks in that they include systematic bits and parity bits determined from the systematic bits. The plurality of horizontal CBS constitutes a transport block (TB).

Correspondingly, the structure includes vertical CBs containing $n_2$ bits, including $k_2$ encoder input bits and a vertical check block 206 containing $n_2-k_2$ parity bits. It is noted that $n_2$ and $k_2$ are not depicted directly in FIG. 1. The $k_2$ input bits include M encoder input bits from each of the L horizontal CBs, where M≥1, such that $k_2=M\times L$. In other words, the $k_2$ input bits include the bits from one of the K columns, and each column is M bits wide. The bits of a set of M×L encoder input bits and the bits of a corresponding vertical check block 206 containing $n_2-k_2$ parity bits may be viewed as a vertical code block, such that the encoder input bits 202 and the vertical check blocks 206 together constitute a plurality of vertical CBs. In some embodiments, the vertical CBs are systematic code blocks in the sense that they each contain a first section (containing M encoder input bits from each horizontal CB) and a second section containing parity determined from the first section. In the illustrated example:

the number of horizontal CBs=L;
the number of encoder input bits in each horizontal CB=$k_1$;
the number of bits in a horizontal CB=$n_1$;
the number of parity bits in a horizontal CB=size of horizontal check block=$n_1-k_1$;
the number of encoder input bits from each horizontal CB included in a vertical CB=M;
the number of encoder input bits in each vertical CB=L×M=$k_2$ (not shown);
the number of bits in each vertical CB=$n_2$ (not shown);
number of parity bits in a vertical CB=size of vertical check block 206=$n_2-k_2$; and
number of vertical CBs=number of vertical check blocks=K.

Throughout this description, reference is made to "horizontal", as in horizontal code block, and horizontal check block and to "vertical" as in vertical code block, vertical check block, vertical parity block. These terms are used for convenience in understanding the layout in some of the Figures, including FIGS. 1 and 2, and to distinguish the two types of code blocks and check blocks from each other. However, these terms are not meant to imply any physical structure. More generally, the horizontal and vertical code blocks can simply be referred to as first and second code blocks. The horizontal code block is simply a first systematic code block containing systematic bits and parity bits (for the embodiment of FIG. 1 where the parity bits are described to be a horizontal check block) or a first non-systematic code block. A set of such first systematic code blocks or first non-systematic code blocks are generated, and these may correspond collectively to a TB. In addition, a vertical code block is simply a second systematic code block containing systematic bits and a check block containing parity bits. In examples, the systematic bits of each second systematic code block include at least one bit from each of the first code blocks. The parity bits of the second systematic code block are determined from the systematic bits, and for the embodiment of FIG. 1, these are referred to as a vertical check block.

The encoder input bits 202 contain the information bits to be transferred. Each row within horizontal check block 204 contains parity bits for the corresponding row of encoder input bits 202. For the purpose of this description, the encoder input bits 202 are the bits that are subject to coding to produce the parity bits. The encoder input bits include the information bits to be transferred, and in some embodiments may also include additional bits such as CRC bits. The horizontal check block 204 contains parity bits for use in decoding the horizontal CB. After each decoding attempt, where CRC bits are present, a CRC check can be run to determine if the horizontal CB has been successfully decoded. Similarly, each vertical check block 206 contains parity bits for the corresponding column of encoder input bits 202. For example, each vertical check block 206 contains $n_2-k_2$ parity bits for use in decoding a vertical CB. Since a vertical CB does not have a CRC on the encoder input bits taken from the horizontal CBs, there is no capability to check whether a vertical CB has been successfully decoded. However, the vertical CB decoder/decoding step will pass the processed encoder input bits (improved log-likelihood ratio (LLR) and possibly corrected decoded) to the horizontal code block decoder/decoding step; it is the horizontal CB decoder's job to ensure that each horizontal CB is successfully decoded by running a CRC check on the decoded encoder input bits. Also, while a vertical check block 206 is depicted as having a rectangular/two dimensional structure in FIG. 1, this does not imply any particular limitation on how the $n_2-k_2$ parity bits of one vertical check block are transmitted. Typically all the bits of one vertical check block would be transmitted as part of a single retransmission. The vertical check blocks 206 collectively are referred to herein as a vertical parity check block.

FIG. 1 also includes dashed lines to indicate separations between horizontal code blocks and also to show separation between the sets of input bits that used as encoder input bits for the vertical CBS.

Initially, the horizontal code blocks are all transmitted—this includes the encoder input bits and the horizontal check blocks. In some embodiments, each horizontal CB of FIG. 1 is a CB of a systematic low density parity check (LDPC) code. When one horizontal CB fails, some encoder input bits in the corresponding horizontal are in error. However, even when a horizontal CB is in error, the log-likelihood ration (LLR) of the encoder input bits are improved in the decoding process, which can be used in the iterative decoding process that follows. For the CBs that have passed CRC check, their LLRs can be set at a predefined large value, so as to facilitate the vertical decoding process. In addition, with each iteration of LDPC decoding, the LLRs corresponding to the correctly decoded horizontal CBs can always be reset back to the predefined large value.

When no horizontal-CB is in error, no vertical check blocks are transmitted. When there are horizontal-CBs in error, the transmitter transmits one or more vertical check blocks. In some embodiments, the transmitter transmits up-to-K vertical check-blocks to the receiver, where K is the total number of vertical check blocks. In some embodiments, the number K of vertical check blocks equal the number L of horizontal CBs i.e. K=number of vertical check blocks=L. The vertical check blocks may be sent in response to one or more negative acknowledgements (NACKs) received from the receiver. For example, in some embodiments, sets of vertical check blocks are transmitted that include:
- a first retransmission containing $m_1$ vertical check blocks in response to a first NACK;
- a second retransmission containing $m_2$ vertical check blocks in response to a second NACK;
- ...
- a Qth retransmission containing $m_Q$ vertical check blocks in response to an Qth NACK;
- each of $m_1, m_2, \ldots, m_Q$ is >=1, and $m_1+m_2+\ldots+m_Q$=K=number of vertical check blocks.

In some embodiments, each set of vertical check blocks is only transmitted if the corresponding NACK is received. For example, if no second NACK is received, then HARQ re-transmission ends after the first retransmission.

In some embodiments, how many vertical check blocks to transmit in response to each NACK will be at transmitter's discretion, e.g. based on the link adaption accuracy of the specific receiver.

In general, the transmitter is not aware of the specific row CB(s) that is/are in error. In some embodiments, to generate the vertical parity bits, the transmitter includes the same number of encoder input bits from each horizontal-CB. In the above example, this number is M. Furthermore, in some embodiments, the number of input bits used to generate each vertical check block is the same as the number of encoder input bits for each horizontal-CB. The decoder uses the newly received vertical check blocks to correct the erroneous encoder input bits, using the log-likelihood ratios (LLRs) from the horizontal-decoding output. For example, in a case where there are 4 horizontal-CBs, the transmitter may include approximately ¼ encoder input bits from each of the 4 horizontal-CBs to calculate a vertical check block. This satisfies both of the above constraints, namely the same number of encoder input bits from each horizontal CB, and the same number of input bits used to compute the vertical check block as were used to compute the horizontal check block. By taking another about ¼ encoder input bits from each horizontal-CB, the transmitter can form another vertical check block, and so on.

In some cases, it may not be possible to satisfy the two constraints referred to above exactly, where numbers do not divide equally. For example, if a horizontal code block contains 27 systematic bits, and vertical parity is computed using sets of 5 horizontal code blocks, ideally, there would be 5 vertical code blocks each based on 27/5 bits from each of the horizontal code blocks. But it is not possible to divide the 27 bits equally into 5, so an approximation can be made. For example, four of the vertical check blocks could be based on 5 bits from each horizontal code block, and one of the vertical check blocks could be based on the remaining 7 bits from each horizontal code block.

The output from the vertical codes, in the form of updated LLRs in the corresponding encoder input bits, is passed to the horizontal codes. The horizontal decoder can then decode the previous erroneous CB(s) again. This approach does not need to know how many CBs or which CBs are in error. Since the decoder output is soft, every vertical check block helps (even when all horizontal CBs are in error).

As more horizontal CB are decoded correctly, it becomes easier for vertical CBs to be decoded. Also, if more vertical CBs are decoded correctly, it is easier for horizontal CBs to be decoded. Thus, it is advantageous to transmit more vertical check blocks such that the chance for all CBs to be successfully decoded is increased. Effectively, code blocks are combined via vertical check blocks. Furthermore, even when the vertical CBs are not correctly decoded, the vertical check blocks still improve the LLR of the corresponding encoder input bits, which can be passed to the horizontal CBs, and can be used to help decode all the horizontal CBs. If some horizontal-CBs have been successfully decoded, then the vertical codes have a reduced code-rate when compared to the original horizontal-CB, assuming that the number encoder input bits in each vertical CB is similar to that in each horizontal CB. As can be seen, transmitting more vertical check blocks increases the chances for the decoding of horizontal-CBs.

Compared to the CBG based approach described in the background, this approach eliminates the need for index feedback. In other words, the transmitter does not need to know which CBs are in error to transmit remedying bits so as to ensure the reliability of the physical link.

Compared to an outer code based approach, in the receiver, this approach does not discard any received signal, and in the transmitter, no new encoder input bits are transmitted for the receiver to decode. In this way, the provided approach significantly increases the retransmission efficiency. It is worth noticing that while the outer code based approach is not an IR approach, the provided approach is. Thus, with the provided approach, the receiver does not need to know which CBs are in error, and the approach remains an IR retransmission scheme.

An additional benefit is that retransmission can be rateless, in the sense that there is no fixed rate. The effective rate decreases with each retransmission. As soon as the receiver accumulates enough energy (in contrast to receipt of sufficient correct CBs as in the erasure code based case), the data in a TB can be successfully received.

Figure 2:
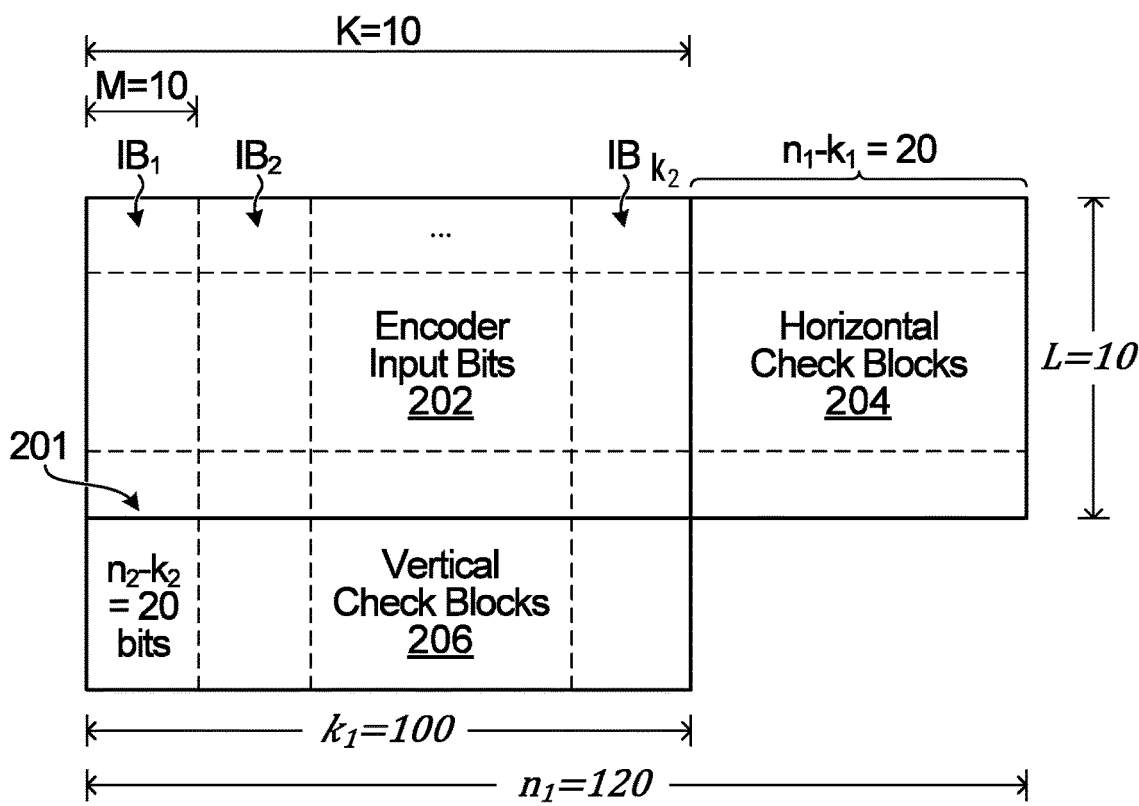
FIG. 2 depicts a specific example of the approach of FIG. 1.

Referring to FIG. 2, shown is a specific example of the structure of FIG. 1. In this example, $k_1$=number of encoder input bits=100; $n_1$=horizontal CB size=120, such that $n_1-k_1$=number of parity bits in a horizontal CB=20. There are 20 horizontal parity bits per 100 encoder input bits. The overall TB is composed of L=10 horizontal CBs. So in an ideal scenario, there will be K=L=10 vertical check blocks. In addition, ideally each vertical check block is based on the same number of encoder input bits as were used to determine horizontal parity, in this example, $k_{1=100}$. In the illustrated example, each vertical check block is determined based on M=10 bits from each horizontal CB, for a total of (L=10)×(M=10)=100 input bits.

However, in some embodiments, the number of vertical check blocks does not need to be equal to the number of horizontal CBs, and/or the number of bits input to calculation of a vertical check block does not necessarily need to equal the number of bits input to the calculation of a horizontal check block.

Figure 3:
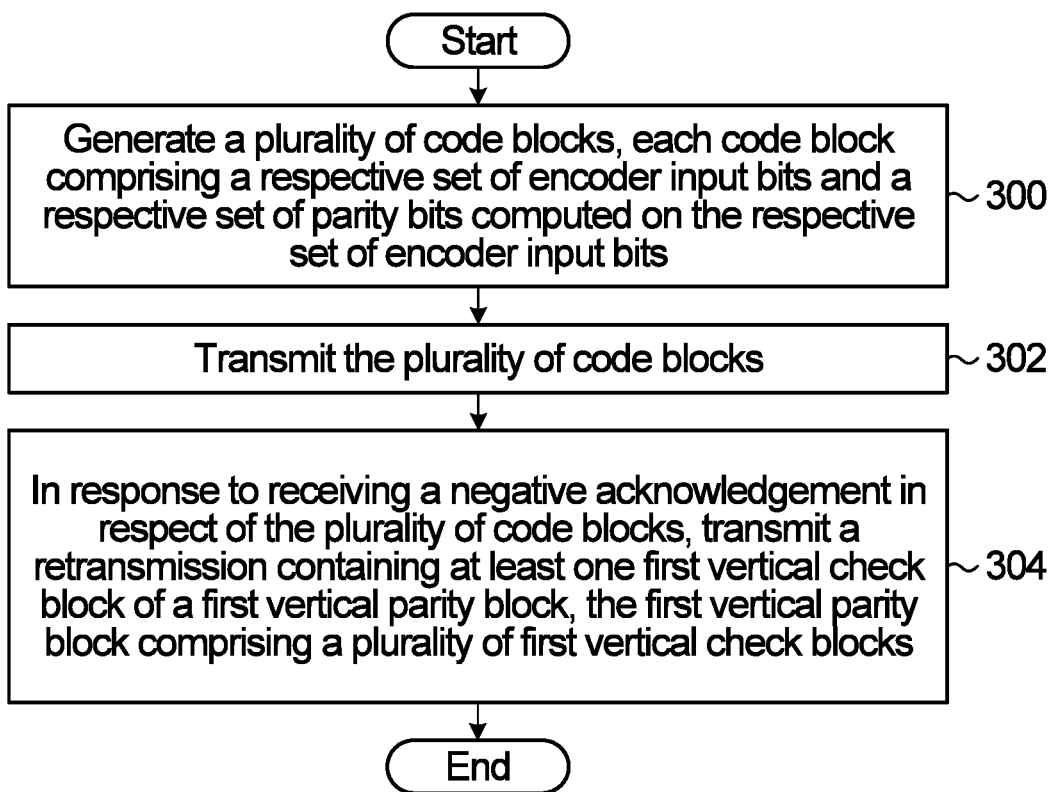
FIG. 3 is a flowchart of a method of H-ARQ retransmission in a telecommunications network, according to one embodiment.

FIG. 3 illustrates a flow chart of a method used in H-ARQ telecommunications in accordance with the above-described embodiment. The method begins in block 300 with generating a plurality of code blocks, each code block comprising a respective set of encoder input bits and a respective set of parity bits determined from the respective set of encoder input bits. In block 302, the plurality of code blocks are transmitted. Collectively these may be viewed as a transport block. In block 304, in response to receiving a negative acknowledgement in respect of the plurality of code blocks, a retransmission is transmitted containing at least one first vertical check block of a first vertical parity block. The first vertical parity block comprises a plurality of first vertical check blocks, each first vertical check block determined from a respective set of at least one bit that includes encoder input bits from each of the plurality of code blocks, each encoder input bit included in one and only one respective set of at least one bit. In some embodiments, the number of encoder input bits used from each horizontal code block for each vertical check block is approximately equal to the number of encoder input bits in each horizontal CB divided by the number of vertical check blocks. If a further NACK is received, the method loops back to block 304. Otherwise, if an ACK is received, the method ends.

Interleave Data for Further Sets of Vertical Check Blocks

In some embodiments, after K vertical check blocks have been transmitted, if needed, another set of K vertical check blocks is formed by taking encoder input bits from interleaved horizontal CBs. According to another embodiment, a different set of interleavers is used to create different sets of vertical check blocks. This has the advantage of avoiding retransmitting a vertical check block for an already successfully decoded vertical CB.

Figure 4C:
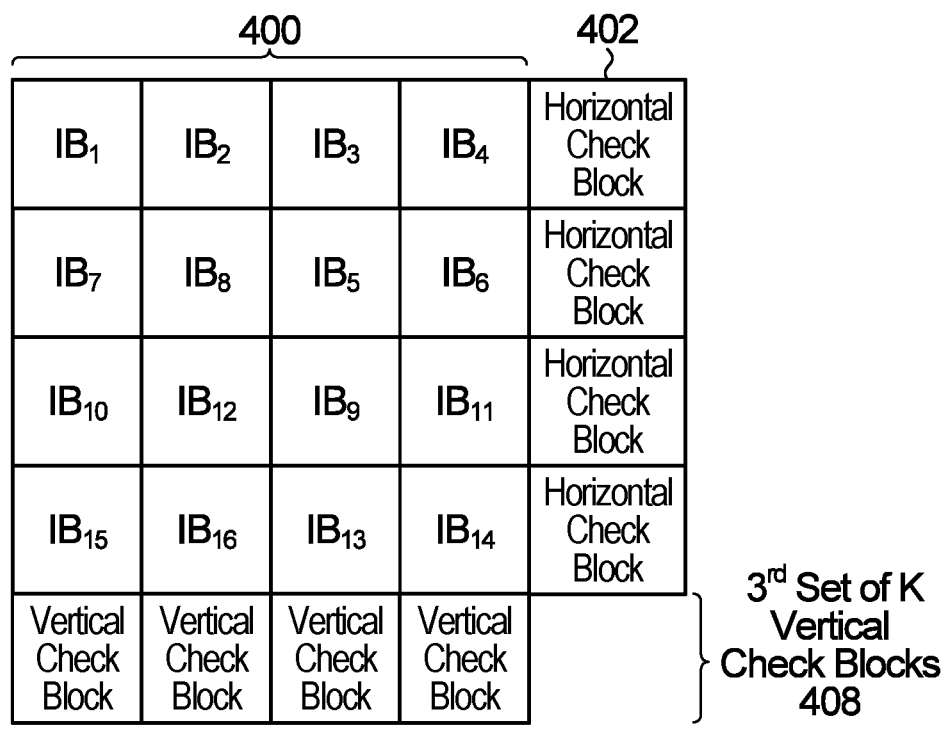

An example is shown in FIGS. 4A, 4B, 4C. FIG. 4A shows a transport block 400, with the encoder input bits divided into sets of encoder input bits $IB_1$, $IB_2$, ..., $IB_{16}$. Horizontal check blocks 402 are determined based on rows within the transport block, and vertical check blocks 404 are determined based columns of sets of encoder input bits. FIG. 4B shows the encoder input bits after interleaving. In this example, interleaving is performed as between blocks of encoder input bits in the rows. It can be seen that in the first row, the order of the blocks is not changed, but in the second, third and fourth rows, the order is changed. A new set of vertical check blocks 406 is determined based on the reordered encoder input bits. FIG. 4C shows the encoder input bits after a different interleaving. It can be seen that in the first row, the order of the blocks is not changed, but in the second, third and fourth rows, the order is changed. A new set of vertical check blocks 408 is determined based on the reordered encoder input bits. Initially, horizontal CBs, including the encoder input bits and the horizontal check blocks, are transmitted. Then, vertical check blocks from the first set 404 are transmitted if necessary. Then, vertical check blocks from the second set 406 are transmitted if necessary. Then, vertical check blocks from the third set 408 are transmitted if necessary. Further sets of vertical check blocks may be transmitted if at least one horizontal CB still fails to be decoded successfully.

With the example of FIGS. 4A, 4B and 4C, the interleaving is performed at the information bit sub-block level. However, in an alternative embodiment, the interleaving is bit-wise interleaving. More generally, the sets of bits for use in determining the vertical check blocks of the first vertical parity block are organized differently than the sets of bits for use in determining the second vertical check blocks of the second parity block. Sub-block level interleaving and bit-wise interleaving are two specific examples of different organization.

As a result, this embodiment creates a class of physical-layer rate-less codes. Unlike outer-codes, which accumulate correctly decoded CBs, physical-layer rate-less codes collect received energy. No received energy is discarded, and every bit of received energy helps decode the final code (i.e. the transport block).

More generally, denote $\Pi_{i,j}$ being an interleaver for the encoder input bits in the $j^{th}$ horizontal-CB, for the generation of an $i^{th}$ set of K vertical check blocks. By defining sets of $\{\Pi_{i,j}\}$, with j=1, ..., K, and i=1, ... $N_s$, it is possible to produce $N_s$ sets of K vertical check blocks. This produces a class of rate-less codes. Together with the original transmission, each set of K vertical check blocks contributes equally to the decoding of the transport block.

The decoding process takes the following form:
receive transport block including the set of horizontal code blocks;
decode the horizontal CBs;
upon failure to decode at least one horizontal CB, transmit NACK;
receive $m_1$ vertical check blocks from a first set of K vertical check blocks;
decode vertical code blocks taking into account vertical check blocks from the first set of K vertical check blocks;
decode horizontal CBs;
upon failure to decode at least one horizontal CB, transmit NACK;
receive $m_2$ vertical check blocks from the first set of K vertical check blocks;
decode vertical code blocks taking into account vertical check blocks from the first set of K vertical check blocks;
decode horizontal CBs;
. . .
upon failure to decode at least one horizontal CB, transmit NACK;
receive $m_Q$ vertical check blocks from the first set of K vertical check blocks;
decode vertical code blocks taking into account vertical check blocks from the first set of K vertical check blocks;
decode horizontal CBs;
upon failure to decode at least one horizontal CB, transmit NACK;
receive $m_1$ vertical check blocks from a second set of K vertical check blocks;
decode vertical code blocks taking into account vertical check blocks from the second set of K vertical check blocks;
decode horizontal CBS;
upon failure to decode at least one horizontal CB, transmit NACK;
receive $m_2$ vertical check blocks from the second set of K vertical check blocks;

decode vertical code blocks taking into account vertical check blocks from the second set of K vertical check blocks;

decode horizontal CBs;

. . .

upon failure to decode at least one horizontal CB, transmit NACK;

receive $m_Q$ vertical check blocks from the second set of K vertical check blocks;

decode vertical code blocks taking into account vertical check blocks from the second set of K vertical check blocks;

and so on for further sets of K vertical check blocks, up to $N_s$ sets.

In the above example, each set of K vertical check blocks is divided into Q sets which are transmitted in response to respective NACKs. Note that Q is >=1, and more generally, Q is not necessarily the same for each set of K vertical check blocks.

As an advantage of this embodiment, there is no need for feedback to tell the transmitter which CBs or CBGs are in error. Furthermore, no unnecessary retransmission is required in the H-ARQ process, as the receiver can just use the newly received vertical check blocks to update the LLRs of the corresponding encoder input bits.

Also, unlike the use of the aforementioned outer codes, H-ARQ is truly employed in an IR fashion, as no received information is unused, and all accumulated energy is used in decoding the equivalent block code, which happens to be the transport block.

Figure 5:
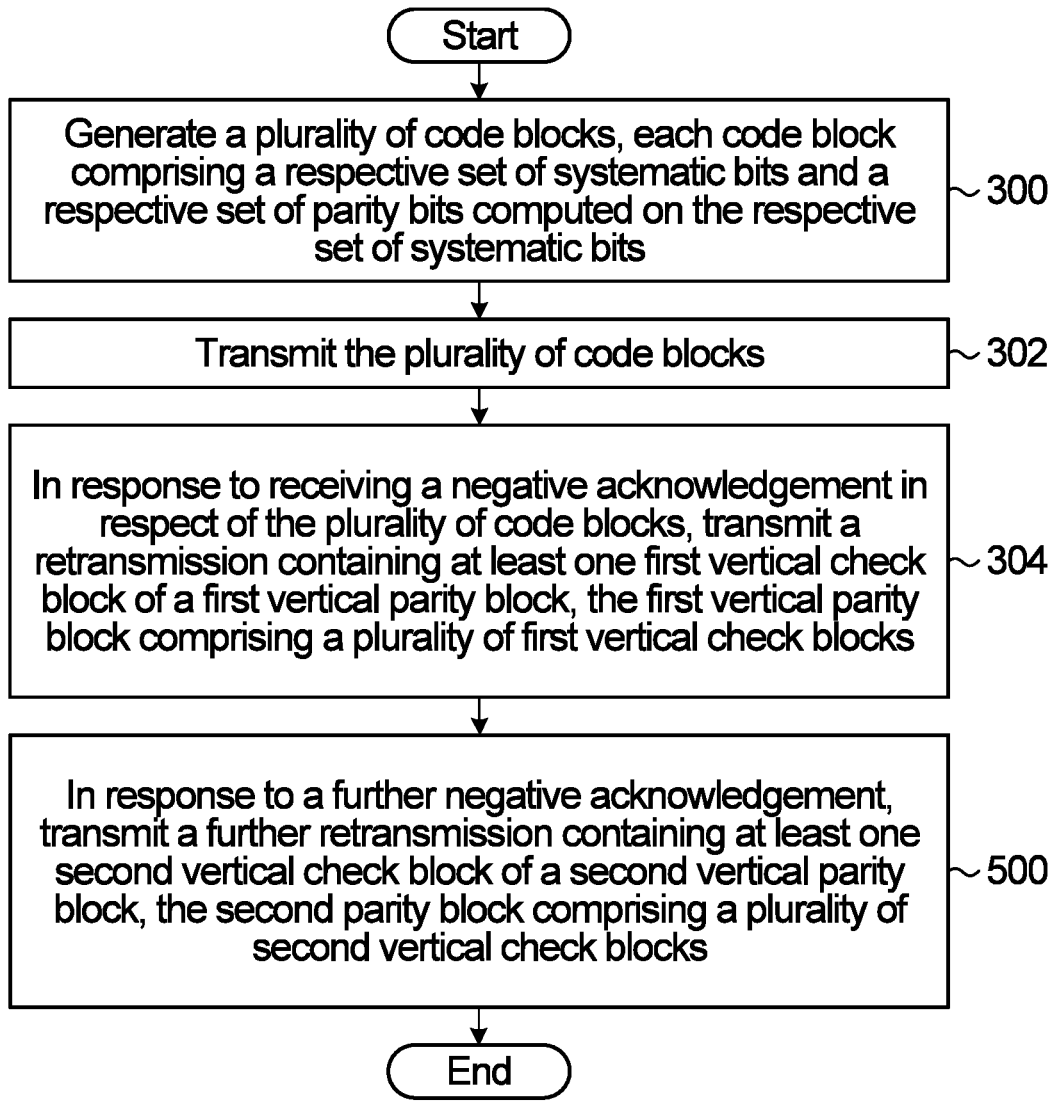
FIG. 5 is a flowchart of a method of H-ARQ retransmission in a telecommunications network, according to one embodiment.

FIG. 5 illustrates a flow chart of a method used in H-ARQ telecommunications in accordance with the above-described embodiment. Steps 302,304,306 are the same as described previously with reference to FIG. 3. The method continues in block 500 with, in response to a further negative acknowledgement transmitting a further retransmission containing at least one second vertical check block of a second vertical parity block, the second parity block comprising a plurality of second vertical check blocks, each second vertical check block determined from a respective set of at least one bit that includes encoder input bits from each of the plurality of code blocks, each encoder input bit included in one and only one respective set of at least one bit. As before, in some embodiments, the number of encoder input bits used from each code block for each vertical check block is approximately equal to the number of encoder input bits in each horizontal CB divided by the number of vertical check blocks. The respective sets of bits for use in computing the first vertical check blocks of the first vertical parity block are organized differently than the respective sets of bits for use in computing the second vertical check blocks of the second vertical parity block. The method produces a rate-less code in which the code rate decreases with each additional vertical parity block transmission.

Figure 6:
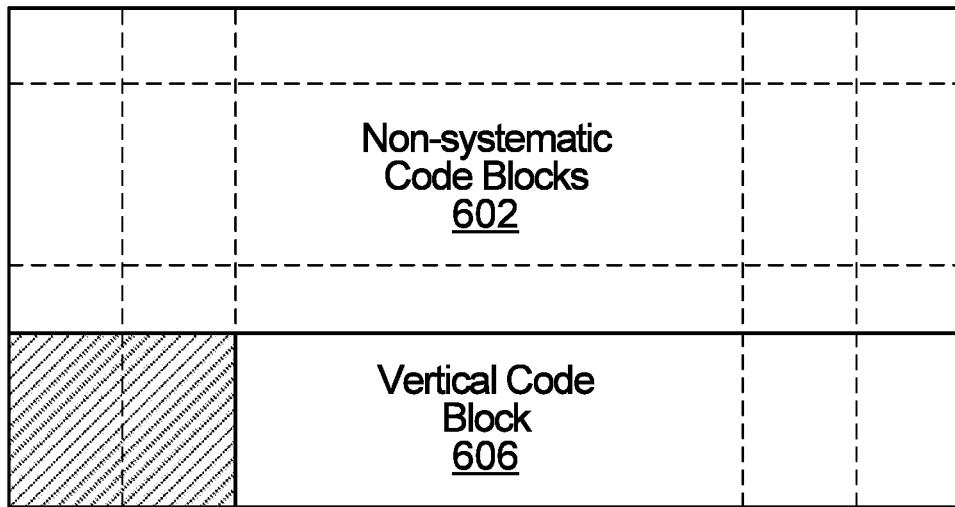
FIG. 6 depicts an example of a code-based approach to H-ARQ provided by an embodiment of the application where horizontal code blocks are non-systematic code blocks.

FIG. 6 illustrates the structure of a code for use in an IR transmission scheme provided by an embodiment of the disclosure. The overall code is based on a plurality of non-systematic codewords 602. Each non-systematic codeword is determined based on a set of encoder input bits, but the encoder input bits do not appear in the codeword as systematic bits. Also shown are vertical check blocks 206. Each non-systematic codeword may be viewed as a horizontal code block. The plurality of horizontal CBs constitutes a transport block (TB). Each column of bits from within the non-systematic code blocks 602 (including M bits from each horizontal CB) and the corresponding bits in the vertical check blocks 606 may be viewed as a vertical code block, such that the bits of the non-systematic code blocks 602 and the vertical check block 606 together constitute a plurality of vertical CBs. The vertical CBs are systematic code blocks in the sense that they each contain a first section (in this case containing bits from each horizontal CB) and a second section containing parity determined from the first section.

Each horizontal CB 602 may be produced from a corresponding set of encoder input bits using a non-systematic encoder, such as a convolutional code to name a specific example. Similarly, each vertical check block 606 contains parity bits for the corresponding column of bits within the non-systematic code blocks 602, for use in decoding the vertical CB. Since the vertical check block does not contain a CRC, it is still up to the horizontal CB decoding to determine if a non-systematic code block has been successfully received.

Initially, the horizontal code blocks are all transmitted. When one horizontal CB fails, some encoder input bits in the horizontal CB are in error. However, even when a horizontal CB is in error, the log-likelihood ratio (LLR) of the bits are improved in the decoding process, which can be used in the iterative decoding process that follows. For the CBs that have passed CRC check, their LLRs can be set at a pre-defined large value, so as to facilitate the vertical decoding process. In addition, with each iteration of decoding, the LLRs corresponding to the correctly decoded horizontal-CBs can always be reset back to the predefined large value.

When no horizontal-CB is in error, no vertical check blocks are transmitted. When there are horizontal-CBs in error, the transmitter transmits one or more vertical check blocks. In some embodiments, the transmitter transmits up-to-K vertical check-blocks to the user, where K is the total number of horizontal-CBs. The vertical check blocks may be sent in response to one or more negative acknowledgements (NACKs) received from the receiver. For example, in some embodiments, sets of vertical check blocks are transmitted that include:

a first retransmission containing $m_1$ vertical check blocks in response to a first NACK;

a second retransmission containing $m_2$ vertical check blocks in response to a second NACK;

. . .

a Qth retransmission containing $m_Q$ vertical check blocks in response to an Qth NACK;

each of $m_1$, $m_2$, . . . , $m_Q$ is >=1, and $m_1 + m_2 + \ldots + m_Q = K$ = number of vertical check blocks.

Each set of vertical check blocks is only transmitted if the corresponding NACK is received. For example, if no second NACK is received, then HARQ re-transmission ends after the first retransmission.

In some embodiments, how many vertical check-blocks to transmit in response to each NACK will be at transmitter's discretion, e.g. based on the link adaption accuracy of the specific receiver.

The output from the vertical codes, in the form of updated LLRs in the corresponding bits of the horizontal CBs, is passed to decoder of the horizontal CBs. The horizontal decoder can then decode the previous erroneous CB(s) again. This approach does not need to know how many CBs or which CBs are in error. Since the decoder output is soft, every vertical check block helps (even when all horizontal CBs are in error).

As more horizontal CBs are decoded correctly, it becomes easier for vertical CBs to be decoded. Also, if more vertical CBs are decoded correctly, it is easier for horizontal CBs to be decoded. Thus, it is advantageous to transmit more vertical check blocks such that the chance for all CBs to be successfully decoded is increased. Effectively, horizontal CBs are combined via vertical check blocks.

Figure 7:
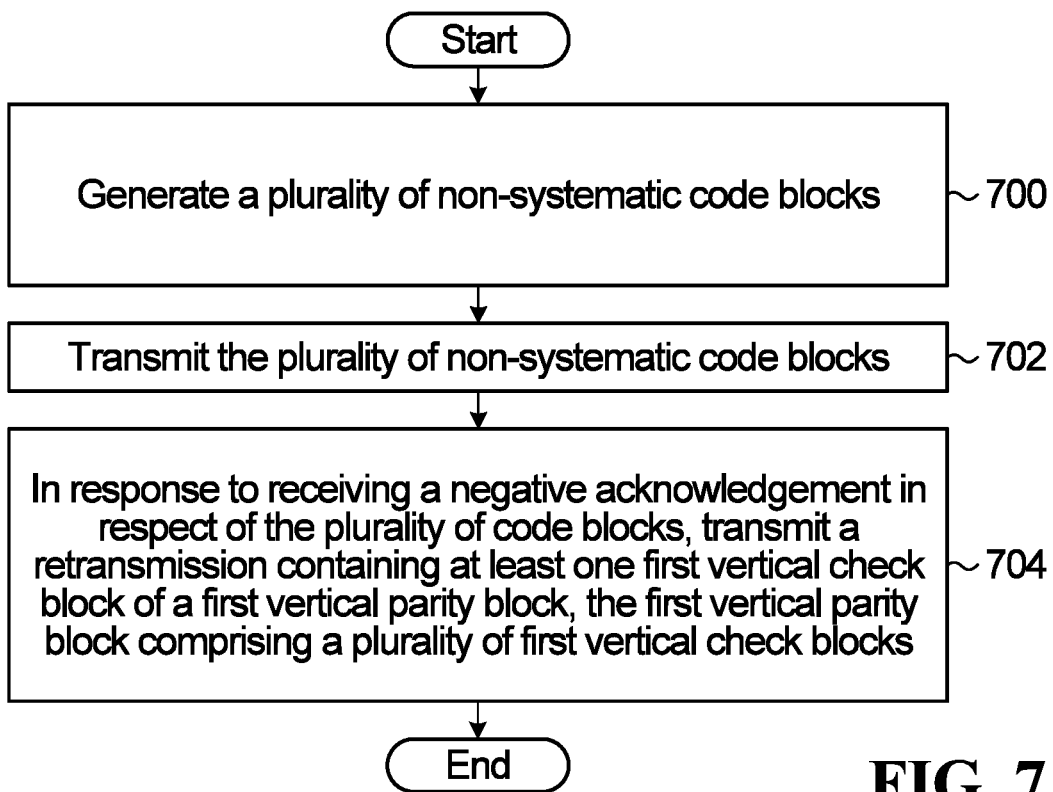
FIG. 7 is a flowchart of a method of H-ARQ retransmission in a telecommunications network, according to one embodiment.

FIG. 7 illustrates a flow chart of a method used in H-ARQ telecommunications in accordance with the above-described embodiment. The method begins in block 700 with generating a plurality of non-systematic code blocks. In block 702, the plurality of code blocks are transmitted. Collectively these may be viewed as a transport block. In block 704, in response to receiving a negative acknowledgement in respect of the plurality of code blocks, a retransmission is transmitted containing at least one first vertical check block of a first vertical parity block. The first vertical parity block consists of a plurality of first vertical check blocks, each first vertical check block determined from a respective set of at least one bit that includes bits from each of the plurality of horizontal code blocks, each bit of the plurality of horizontal code blocks included in one and only one respective set of at least one bit. In some embodiments, the number of bits used from each horizontal CB for each vertical check block is approximately equal to the number of bits in each horizontal CB divided by the number of vertical check blocks. If a further NACK is received, the method loops back to block 704. Otherwise, if an ACK is received, the method ends.

Interleave Data for Further Sets of Vertical Check Blocks

Figure 8C:
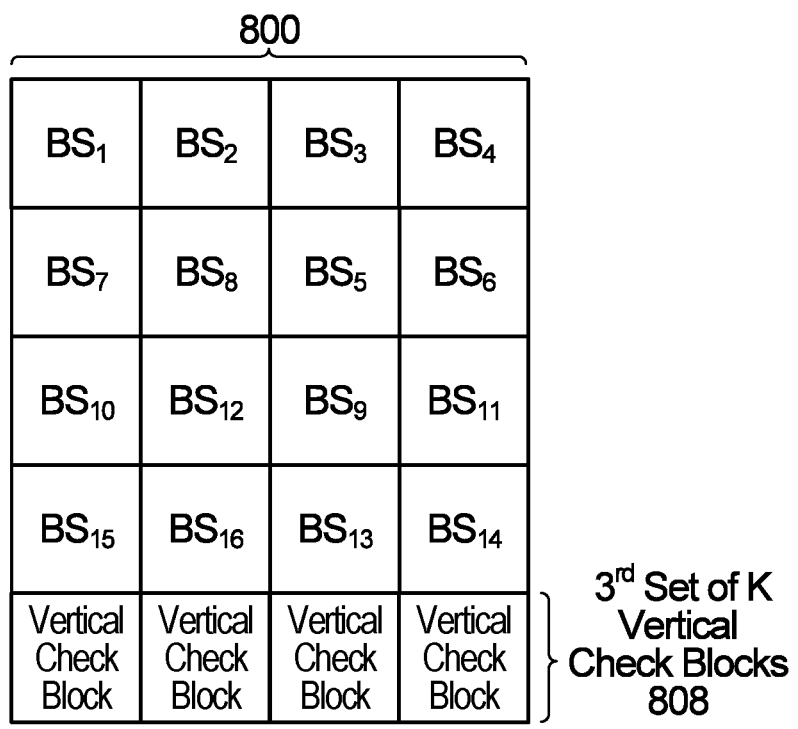

The interleaving approach described above with reference to FIG. 4 can also be applied for this embodiment. An example is shown in FIGS. 8A, 8B and 8C, each showing a respective set of vertical check blocks 404,806,868 for differently ordered bits from the horizontal code blocks. For this example, the non-systematic codewords are divided into bit subsets (BS) $BS_1, \ldots, BS_{14}$. Each vertical check block is determined from columns of bit subsets.

The decoding is the same as before, except that the decoder for the horizontal CBs will be based on the non-systematic code used to produce the horizontal CBs.

Figure 9:
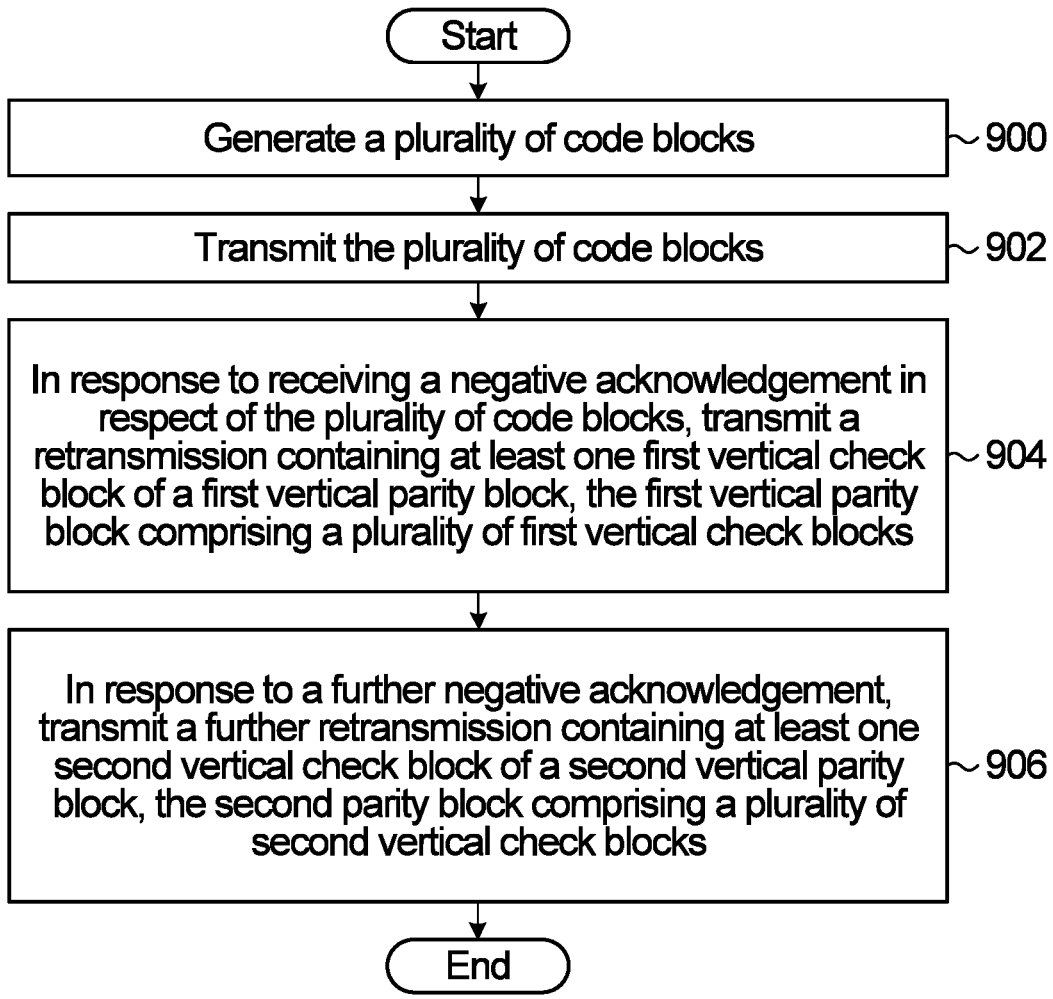
FIG. 9 is a flowchart of a method of H-ARQ retransmission in a telecommunications network, according to one embodiment.

FIG. 9 illustrates a flow chart of a method used in H-ARQ telecommunications in accordance with the above-described embodiment. The method begins in block 900 with generating a plurality of code blocks. The code blocks may be systematic code blocks or non-systematic code blocks. In block 902, the plurality of code blocks are transmitted. Collectively these may be viewed as a transport block. In block 904, in response to receiving a negative acknowledgement in respect of the plurality of code blocks, a retransmission is transmitted containing at least one first vertical check block of a first vertical parity block. The first vertical parity block comprises a plurality of first vertical check blocks, each first vertical check block determined from a respective set of at least one bit that includes bits from each of the plurality of horizontal code blocks, each bit included in one and only one respective set of at least one bit. In some embodiments, the number of bits used from horizontal CBs for each vertical check block is approximately equal to the number of encoder input bits in each horizontal CB divided by the number of vertical check blocks.

If a further NACK is received, the method loops back to block 904. Otherwise, if an ACK is received, the method ends. The method continues in block 906 with, in response to a further negative acknowledgement, received after all the vertical check blocks of the first vertical parity block have been transmitted, transmitting a further retransmission containing at least one second vertical check block of a second vertical parity block, the second parity block comprising a plurality of second vertical check blocks, each second vertical check block comprising at least one check on vertical determined from a respective set of at least one bit from each of the plurality of code blocks, each bit included in one and only one respective set of at least one bit. The respective sets of bits for use in computing the first vertical check blocks of the first vertical parity block are defined differently than the respective sets of bits for use in computing the second vertical check blocks of the second vertical parity block. The method produces a rate-less code in which the code rate decreases with each additional vertical parity block transmission.

ACK/NACK

In the described embodiments, the retransmissions (containing the vertical check blocks) are transmitted in response to negative acknowledgements. Alternatively, any of the embodiments described herein can be modified such that retransmissions are sent without waiting for negative acknowledgments, for example based on a timer expiring, or without waiting for a negative acknowledgement or a timer to expire, for example according to a set schedule. In this case, the transmitter keeps retransmitting until some maximum number of retransmissions is reached, or an ACK is received.

Content of the Plurality of Code Blocks

In the described embodiments, the plurality of horizontal CBs over which vertical parity is determined is part of a transport block for a single receiver. Alternatively, any of the embodiments described herein can be employed for situations where the plurality of code blocks includes code blocks from multiple transport blocks for a single receiver. Alternatively, any of the embodiments described herein can be employed for situations where the plurality of code blocks includes code blocks from multiple transport blocks for receivers.

Number of Vertical Parity Bits in Each Retransmission

In the described embodiments, a fixed number of vertical parity bits is transmitted in each retransmission. Alternatively, any of the embodiments described herein can be modified such that the number of vertical parity bits transmitted in each retransmission is in accordance with a configurable schedule. In this case, the schedule would need to be known by both the transmitter and receiver(s). This could be predetermined, or configured through signalling.

Rate-Less Code

As mentioned previously an additional benefit of the provided approach (which is true for any of the described embodiments) is that retransmission can be rate-less, in the sense that there is no fixed rate. The effective rate decreases with each retransmission.

Another advantage that flows from the rate-less aspect is that the overall system is less sensitive to modulation and coding scheme (MCS). Typically, the MCS has some associated coding rate that is selected based on channel conditions. With the provided approach, a relatively higher coding rate can be used initially; if the channel is such that the code blocks are not successfully received, retransmissions are made with the result that the effective code rate drops. Or, a code rate can be selected based on an assumption about the channel which may be incorrect. Then, if the code rate was too high, this is self-adjusted downwards through the retransmissions containing vertical parity.

Content of Vertical Check Blocks

For any of the embodiments described herein, in one variant, the vertical check blocks contain only parity bits; in other words, they do not repeat any of the bits from the horizontal code blocks that were used to determine the vertical check blocks. Alternatively, in another variant, some of the bits used to determine a vertical check block may be repeated in the vertical check block.

Input to Vertical Check Block Determination

In some embodiments, as described above, each systematic bit of each systematic horizontal code block, or each bit of each non-systematic codeword, is included once and only once in one of the sets of bits used to determine vertical check blocks of one vertical parity block. This is the most efficient way to introduce vertical parity for every bit in a transport block. However, it should be understood that in some embodiments, some bits from the horizontal code blocks may be omitted, and/or some bits from the horizontal code blocks may appear more than once. This will have an effect on the efficiency and reliability of the overall HARQ scheme.

Figure 10:
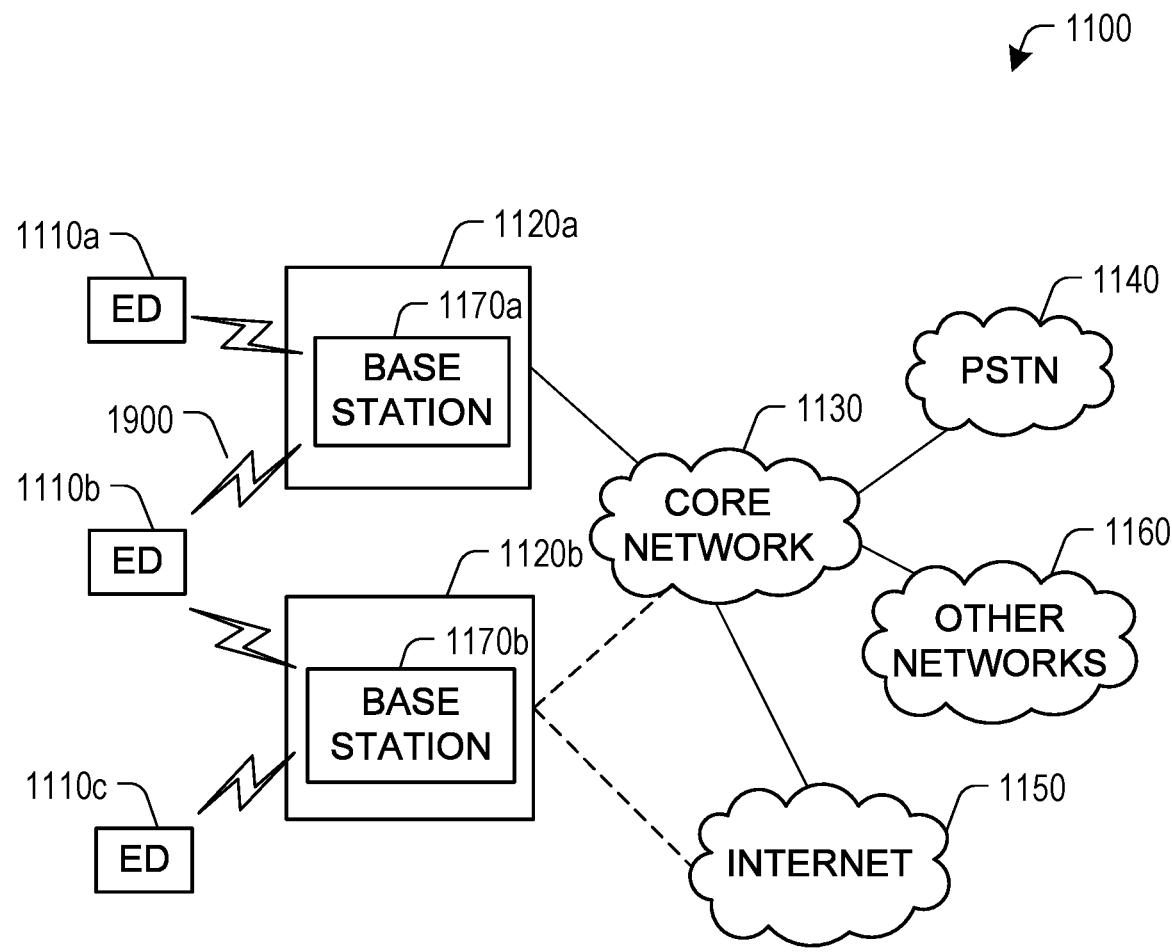
FIG. 10 is a network diagram of a communication system.

FIG. 10 illustrates an example communication system 1100 in which embodiments of the present disclosure could be implemented. In general, the communication system 1100 enables multiple wireless or wired elements to communicate data and other content. The purpose of the communication system 1100 may be to provide content (voice, data, video, text) via broadcast, narrowcast, user device to user device, etc. The communication system 1100 may operate by sharing resources such as bandwidth.

In this example, the communication system 1100 includes electronic devices (ED) 1110a-1110c, radio access networks (RANs) 1120a-1120b, a core network 1130, a public switched telephone network (PSTN) 1140, the internet 1150, and other networks 1160. Although certain numbers of these components or elements are shown in FIG. 10, any reasonable number of these components or elements may be included in the communication system 1100.

The EDs 1110a-1110c are configured to operate, communicate, or both, in the communication system 1100. For example, the EDs 1110a-1110c are configured to transmit, receive, or both via wireless or wired communication channels. Each ED 1110a-1110c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 10, the RANs 1120a-1120b include base stations 1170a-1170b, respectively. Each base station 1170a-1170b is configured to wirelessly interface with one or more of the EDs 1110a-1110c to enable access to any other base station 1170a-1170b, the core network 1130, the PSTN 1140, the internet 1150, and/or the other networks 1160. For example, the base stations 1170a-1170b may include (or be) one or more of several well-known devices, such as a base transceiver station (BTS), a Node-B (NodeB), an evolved Node-B (eNodeB), a Home eNodeB, a gNodeB, a transmission point (TP), a site controller, an access point (AP), or a wireless router. Any ED 1110a-1110c may be alternatively or additionally configured to interface, access, or communicate with any other base station 1170a-1170b, the internet 1150, the core network 1130, the PSTN 1140, the other networks 1160, or any combination of the preceding. The communication system 1100 may include RANs, such as RAN 1120b, wherein the corresponding base station 1170b accesses the core network 1130 via the internet 1150, as shown.

The EDs 1110a-1110c and base stations 1170a-1170b are examples of communication equipment that can be configured to implement some or all of the functionality and/or embodiments described herein. In the embodiment shown in FIG. 10, the base station 1170a forms part of the RAN 1120a, which may include other base stations, base station controller(s) (BSC), radio network controller(s) (RNC), relay nodes, elements, and/or devices. Any base station 1170a, 1170b may be a single element, as shown, or multiple elements, distributed in the corresponding RAN, or otherwise. Also, the base station 1170b forms part of the RAN 1120b, which may include other base stations, elements, and/or devices. Each base station 1170a-1170b transmits and/or receives wireless signals within a particular geographic region or area, sometimes referred to as a "cell" or "coverage area". A cell may be further divided into cell sectors, and a base station 1170a-1170b may, for example, employ multiple transceivers to provide service to multiple sectors. In some embodiments there may be established pico or femto cells where the radio access technology supports such. In some embodiments, multiple transceivers could be used for each cell, for example using multiple-input multiple-output (MIMO) technology. The number of RAN 1120a-1120b shown is exemplary only. Any number of RAN may be contemplated when devising the communication system 1100.

The base stations 1170a-1170b communicate with one or more of the EDs 1110a-1110c over one or more air interfaces 1190 using wireless communication links e.g. radio frequency (RF), microwave, infrared (IR), etc. The air interfaces 1190 may utilize any suitable radio access technology. For example, the communication system 1100 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1190.

A base station 1170a-1170b may implement Universal Mobile Telecommunication System (UMTS) Terrestrial Radio Access (UTRA) to establish an air interface 1190 using wideband CDMA (WCDMA). In doing so, the base station 1170a-1170b may implement protocols such as HSPA, HSPA+ optionally including HSDPA, HSUPA or both. Alternatively, a base station 1170a-1170b may establish an air interface 1190 with Evolved UTMS Terrestrial Radio Access (E-UTRA) using LTE, LTE-A, and/or LTE-B. It is contemplated that the communication system 1100 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 1120a-1120b are in communication with the core network 130 to provide the EDs 1110a-1110c with various services such as voice, data, and other services. The RANs 1120a-1120b and/or the core network 1130 may be in direct or indirect communication with one or more other RANs (not shown), which may or may not be directly served by core network 1130, and may or may not employ the same radio access technology as RAN 1120a, RAN 1120b or both. The core network 1130 may also serve as a gateway access between (i) the RANS 1120a-1120b or EDs 1110a-1110c or both, and (ii) other networks (such as the PSTN 140, the internet 1150, and the other networks 1160). In addition, some or all of the EDs 1110a-1110c may include functionality for communicating with different wireless networks over different wireless links using different wireless technologies and/or protocols. Instead of wireless communication (or in addition thereto), the EDs may communicate via wired communication channels to a service provider or switch (not shown), and to the internet 1150. PSTN 1140 may include circuit switched telephone networks for providing plain old telephone service (POTS). Internet 1150 may include a network of computers and subnets (intranets) or both, and incorporate protocols, such as IP, TCP, UDP. EDs 1110a-1110c may be multimode devices capable of operation according to multiple radio access technologies, and incorporate multiple transceivers necessary to support such.

Figure 11A:
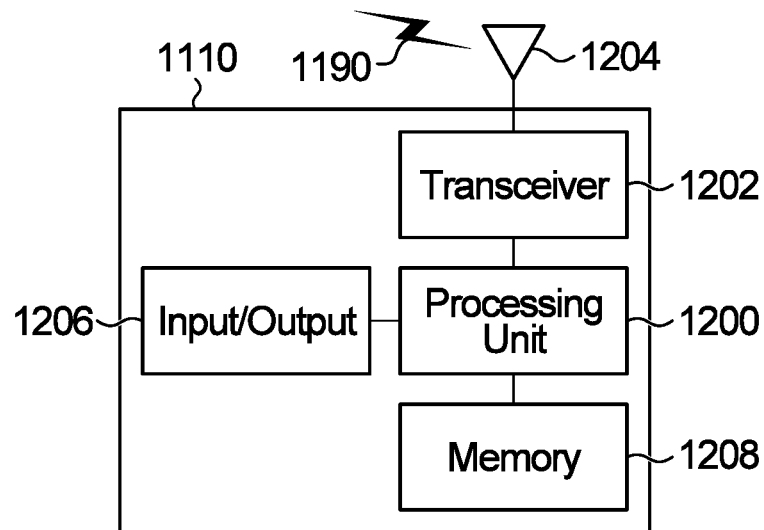
FIG. 11A is a block diagram of a base station.
Figure 11B:
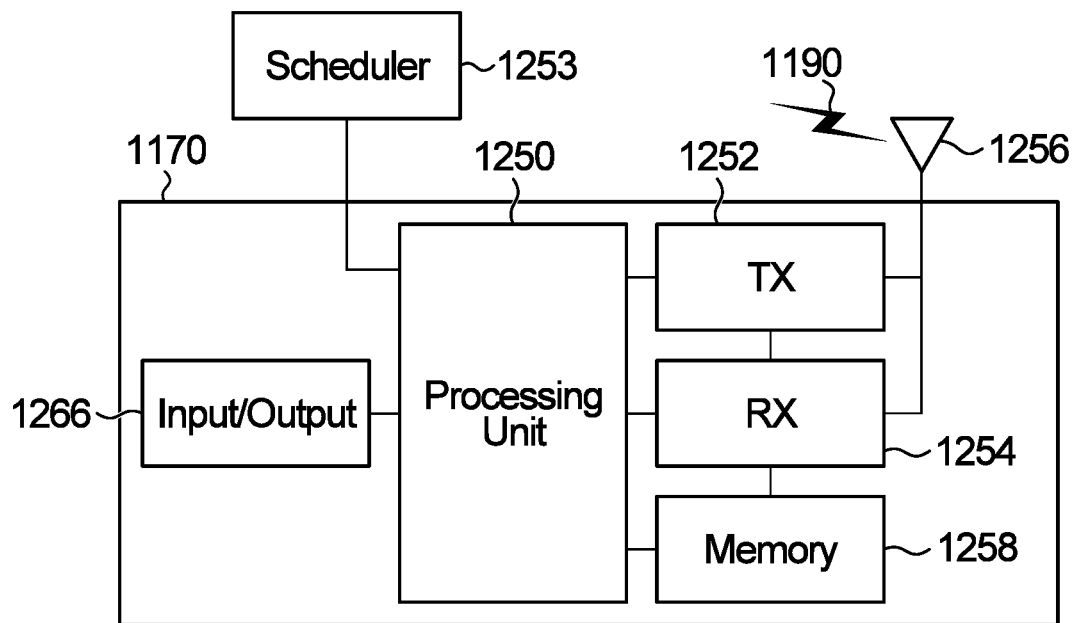
FIG. 11B is a block diagram of an example electronic device.

FIGS. 11A and 11B illustrate example devices that may implement the methods and teachings according to this disclosure. In particular, FIG. 11A illustrates an example ED 1110, and FIG. 2B illustrates an example base station 1170. These components could be used in the communication system 1100 or in any other suitable system. More specifically, the ED 1110 of FIG. 11A may be configured to perform one of the encoding methods and/or one of the decoding methods described herein. This may be achieved by including the functionality in the processor, or in instructions stored in the memory. Alternatively, an additional component specifically designed to perform one of the encoding methods may be provided may be included in the ED 1110. Similarly, the BS 1170 of FIG. 11B may be configured to perform one of the encoding methods and/or one of the decoding methods described herein. This may be achieved by including the functionality in the processor, or in instructions stored in the memory. Alternatively, an additional component specifically designed to perform one of the encoding methods may be provided may be included in the ED 1110.

As shown in FIG. 11A, the ED 1110 includes at least one processing unit 1200. The processing unit 1200 implements various processing operations of the ED 1110. For example, the processing unit 1200 could perform signal coding, data processing, power control, input/output processing, or any other functionality enabling the ED 1110 to operate in the communication system 1100. The processing unit 1200 may also be configured to implement some or all of the functionality and/or embodiments described in more detail above. Each processing unit 1200 includes any suitable processing or computing device configured to perform one or more operations. Each processing unit 1200 could, for example, include a microprocessor, microcontroller, digital signal processor, field programmable gate array, or application specific integrated circuit.

The ED 1110 also includes at least one transceiver 1202. The transceiver 1202 is configured to modulate data or other content for transmission by at least one antenna or Network Interface Controller (NIC) 1204. The transceiver 1202 is also configured to demodulate data or other content received by the at least one antenna 1204. Each transceiver 1202 includes any suitable structure for generating signals for wireless or wired transmission and/or processing signals received wirelessly or by wire. Each antenna 1204 includes any suitable structure for transmitting and/or receiving wireless or wired signals. One or multiple transceivers 1202 could be used in the ED 1110. One or multiple antennas 1204 could be used in the ED 1110. Although shown as a single functional unit, a transceiver 1202 could also be implemented using at least one transmitter and at least one separate receiver.

The ED 1110 further includes one or more input/output devices 1206 or interfaces (such as a wired interface to the internet 1150). The input/output devices 1206 permit interaction with a user or other devices in the network. Each input/output device 1206 includes any suitable structure for providing information to or receiving information from a user, such as a speaker, microphone, keypad, keyboard, display, or touch screen, including network interface communications.

In addition, the ED 1110 includes at least one memory 1208. The memory 1208 stores instructions and data used, generated, or collected by the ED 1110. For example, the memory 1208 could store software instructions or modules configured to implement some or all of the functionality and/or embodiments described above and that are executed by the processing unit(s) 1200. Each memory 1208 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 11B, the base station 1170 includes at least one processing unit 1250, at least one transmitter 1252, at least one receiver 1254, one or more antennas 1256, at least one memory 1258, and one or more input/output devices or interfaces 1266. A transceiver, not shown, may be used instead of the transmitter 1252 and receiver 1254. A scheduler 1253 may be coupled to the processing unit 1250. The scheduler 1253 may be included within or operated separately from the base station 1170. The processing unit 1250 implements various processing operations of the base station 1170, such as signal coding, data processing, power control, input/output processing, or any other functionality. The processing unit 1250 can also be configured to implement some or all of the functionality and/or embodiments described in more detail above. Each processing unit 1250 includes any suitable processing or computing device configured to perform one or more operations. Each processing unit 1250 could, for example, include a microprocessor, microcontroller, digital signal processor, field programmable gate array, or application specific integrated circuit.

Each transmitter 1252 includes any suitable structure for generating signals for wireless or wired transmission to one or more EDs or other devices. Each receiver 1254 includes any suitable structure for processing signals received wirelessly or by wire from one or more EDs or other devices. Although shown as separate components, at least one transmitter 1252 and at least one receiver 1254 could be combined into a transceiver. Each antenna 1256 includes any suitable structure for transmitting and/or receiving wireless or wired signals. Although a common antenna 1256 is shown here as being coupled to both the transmitter 1252 and the receiver 1254, one or more antennas 1256 could be coupled to the transmitter(s) 1252, and one or more separate antennas 1256 could be coupled to the receiver(s) 1254. Each memory 1258 includes any suitable volatile and/or non-volatile storage and retrieval device(s) such as those described above in connection to the ED 1110. The memory 1258 stores instructions and data used, generated, or collected by the base station 1170. For example, the memory 1258 could store software instructions or modules configured to implement some or all of the functionality and/or embodiments described above and that are executed by the processing unit(s) 1250.

Each input/output device 1266 permits interaction with a user or other devices in the network. Each input/output device 1266 includes any suitable structure for providing information to or receiving/providing information from a user, including network interface communications.

Numerous modifications and variations of the present disclosure are possible in light of the above teachings. It is therefore to be understood that within the scope of the appended claims, the disclosure may be practiced otherwise than as specifically described herein.

The invention claimed is:

1. A method for transmitting code blocks, the method comprising:
   transmitting a plurality of code blocks;
   transmitting a first retransmission comprising at least one first check block of a plurality of first check blocks, each first check block of the plurality of first check blocks generated from a first respective set of bits that includes at least one bit from each of the plurality of code blocks; and
   transmitting a second retransmission comprising at least one second check block of a plurality of second check blocks, each second check block of the plurality of second check blocks generated from a second respective set of bits that includes at least one bit from each of the plurality of code blocks such that at least one bit of the second respective set of bits is different from the first respective set of bits.

2. The method of claim 1 further comprising:
   reordering at least one code block of the plurality of code blocks, and generating the at least one second check block based on the plurality of code blocks including the reordered at least one code block.

3. The method of claim 1 further comprising:
   for each code block, dividing bits of the code block into a plurality of sub-blocks, wherein each check block is determined from a set of bits that includes one sub-block from each code block;
   the method further comprising for the at least one further check block:
   reordering the sub-blocks of each code block;
   determining the at least one second check block using the reordered sub-blocks.

4. The method of claim 1 further comprising:
   receiving a first negative acknowledgement, wherein the transmitting the first retransmission comprising the at least one first check block of the plurality of first check blocks is in response to the first negative acknowledgement; and
   receiving a second negative acknowledgement, wherein the transmitting the second retransmission comprising the at least one second check block of the plurality of second check blocks is in response to the second negative acknowledgement.

5. The method of claim 1 further comprising:
   transmitting a third retransmission comprising at least one third check block of a plurality of third check blocks, each third check block of the plurality of third check blocks generated from a third respective set of bits that includes at least one bit from each of the plurality of code blocks such that at least one bit of the third respective set of bits is different from both the first respective set of bits and the second respective set of bits.

6. The method of claim 1 wherein:
   transmitting the plurality of code blocks comprises generating a plurality of systematic code blocks, each systematic code block comprising a respective set of systematic bits and a respective set of parity bits determined from the respective set of systematic bits.

7. An apparatus comprising:
   a processor and a memory;
   the apparatus configured to perform a method comprising:
   transmitting a plurality of code blocks;
   transmitting a first retransmission comprising at least one first check block of a plurality of first check blocks, each first check block of the plurality of first check blocks generated from a first respective set of bits that includes at least one bit from each of the plurality of code blocks; and
   transmitting a second retransmission comprising at least one second check block of a plurality of second check blocks, each second check block of the plurality of second check blocks generated from a second respective set of bits that includes at least one bit from each of the plurality of code blocks such that at least one bit of the second respective set of bits is different from the first respective set of bits.

8. The apparatus of claim 7 further configured to:
   reorder at least one code block of the plurality of code blocks, and generate the at least one second check block based on the plurality of code blocks including the reordered at least one code block.

9. The apparatus of claim 7 further configured to:
   for each code block, divide bits of the code block into a plurality of sub-blocks, wherein each check block is determined from a set of bits that includes one sub-block from each code block;
   for the at least one further check block:
   reorder the sub-blocks of each code block;
   determine the at least one second check block using the reordered sub-blocks.

10. The apparatus of claim 7 further configured to:
    receive a first negative acknowledgement, wherein the transmitting the first retransmission comprising the at least one first check block of the plurality of first check blocks is in response to the first negative acknowledgement; and
    receive a second negative acknowledgement, wherein the transmitting the second retransmission comprising the at least one second check block of the plurality of second check blocks is in response to the second negative acknowledgement.

11. The apparatus of claim 7 further configured to:
    transmit a third retransmission comprising at least one third check block of a plurality of third check blocks, each third check block of the plurality of third check blocks generated from a third respective set of bits that includes at least one bit from each of the plurality of code blocks such that at least one bit of the third respective set of bits is different from both the first respective set of bits and the second respective set of bits.

12. The apparatus of claim 7 configured to transmit the plurality of code blocks by generating a plurality of systematic code blocks, each systematic code block comprising a respective set of systematic bits and a respective set of parity bits determined from the respective set of systematic bits.

13. A method for communicating code blocks, the method comprising:
    receiving a plurality of code blocks;
    receiving a first retransmission comprising at least one first check block of a plurality of first check blocks, each first check block of the plurality of first check blocks generated from a first respective set of bits that includes at least one bit from each of the plurality of code blocks; and receiving a second retransmission comprising at least one second check block of a plurality of second check blocks, each second check block of the plurality of second check blocks generated from a second respective set of bits that includes at least one bit from each of the plurality of code blocks such that at least one bit of the first respective set of bits is different from the second respective set of bits.

14. The method of claim 13 wherein:
at least one code block of the plurality of code blocks is reordered, and the at least one second check block is generated based on the plurality of code blocks including the reordered at least one code block.

15. The method of claim 13 wherein:
for each code block:
  bits of the code block are divided into a plurality of sub-blocks, and each check block is determined from a set of bits that includes one sub-block from each code block; and
for the at least one further check block:
  the sub-blocks of each code block are reordered, and the at least one second check block is determined using the reordered sub-blocks.

16. The method of claim 13 further comprising:
transmitting a first negative acknowledgement, wherein the receiving the first retransmission comprising the at least one first check block of the plurality of first check blocks is in response to the first negative acknowledgement; and
transmitting a second negative acknowledgement, wherein the receiving the second retransmission comprising the at least one second check block of the plurality of second check blocks is in response to the second negative acknowledgement.

17. An apparatus comprising:
a processor and a memory;
the apparatus configured to perform a method comprising:
  receiving a plurality of code blocks;
  receiving a first retransmission comprising at least one first check block of a plurality of first check blocks, each first check block of the plurality of first check blocks generated from a first respective set of bits that includes at least one bit from each of the plurality of code blocks; and
  receiving a second retransmission comprising at least one second check block of a plurality of second check blocks, each second check block of the plurality of second check blocks generated from a second respective set of bits that includes at least one bit from each of the plurality of code blocks such that at least one bit of the first respective set of bits is different from the second respective set of bits.

18. The apparatus of claim 17 wherein:
at least one code block of the plurality of code blocks is reordered, and the at least one second check block is generated based on the plurality of code blocks including the reordered at least one code block.

19. The apparatus of claim 17 wherein:
for each code block:
  bits of the code block are divided into a plurality of sub-blocks, and each check block is determined from a set of bits that includes one sub-block from each code block; and
for the at least one further check block:
  the sub-blocks of each code block are reordered, and
  the at least one second check block is determined using the reordered sub-blocks.

20. The apparatus of claim 17 further configured to:
transmit a first negative acknowledgement, wherein the receiving the first retransmission comprising the at least one first check block of the plurality of first check blocks is in response to the first negative acknowledgement; and
transmit a second negative acknowledgement, wherein the receiving the second retransmission comprising the at least one second check block of the plurality of second check blocks is in response to the second negative acknowledgement.

* * * * *